(12) United States Patent
Ikkink

(10) Patent No.: US 10,359,708 B2
(45) Date of Patent: Jul. 23, 2019

(54) POSITION MEASUREMENT SYSTEM, CALIBRATION METHOD, LITHOGRAPHIC APPARATUS AND DEVICE MANUFACTURING METHOD

(71) Applicant: ASML NETHERLANDS B.V., Veldhoven (NL)

(72) Inventor: Teunis Jan Ikkink, Geldrop (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/095,962

(22) PCT Filed: Apr. 19, 2017

(86) PCT No.: PCT/EP2017/059255
§ 371 (c)(1),
(2) Date: Oct. 24, 2018

(87) PCT Pub. No.: WO2017/194277
PCT Pub. Date: Nov. 16, 2017

(65) Prior Publication Data
US 2019/0137890 A1    May 9, 2019

(30) Foreign Application Priority Data
May 9, 2016   (EP) .................................. 16168724

(51) Int. Cl.
*G03F 7/20*   (2006.01)
*G01D 5/26*   (2006.01)
*G01B 9/02*   (2006.01)

(52) U.S. Cl.
CPC ......... *G03F 7/7085* (2013.01); *G01B 9/0201* (2013.01); *G01B 9/02011* (2013.01); *G01D 5/266* (2013.01)

(58) Field of Classification Search
CPC ...... G03F 7/7085; G01B 9/0201; G01D 5/266
See application file for complete search history.

(56) References Cited

U.S. PATENT DOCUMENTS 5,146,293 A    9/1992  Mercer et al.
5,751,426 A *  5/1998  Nose ................... G03F 7/70633
                                                  356/401
(Continued)

FOREIGN PATENT DOCUMENTS

CN    103092002 B    5/2013
JP    2011043344 A2  3/2011

OTHER PUBLICATIONS

International Search Report and Written Opinion issued in PCT Patent Application No. PCT/EP2017/059255, dated Aug. 21, 2017.

*Primary Examiner* — Steven Whitesell Gordon
(74) *Attorney, Agent, or Firm* — Pillsbury Winthrop Shaw Pittman LLP

(57) ABSTRACT

A position measurement system configured to measure a position of an object. The system includes an optical system to obtain a first measurement wave and a second measurement wave from a radiation source, and to allow the first and second measurement wave to at least partially interfere with each other after interaction of at least one of the first and second measurement wave with the object to form a first detection beam. The system further includes a first detector to receive the first detection beam. The system also has a processing unit configured to receive an output from the first detector and to determine a signal representative for the position of the object from the output, wherein the optical system includes a phase modulator configured to modulate a phase difference between the first measurement wave and the second measurement wave.

20 Claims, 4 Drawing Sheets

(56) References Cited

U.S. PATENT DOCUMENTS

| | | | |
|---|---|---|---|
| 6,137,574 A | 10/2000 | Hill | |
| 9,612,104 B2 * | 4/2017 | Tamiya | G01D 5/34746 |
| 2004/0160611 A1 * | 8/2004 | Li | A61B 5/0059 |
| | | | 356/521 |
| 2005/0030548 A1 * | 2/2005 | Li | A61B 3/1225 |
| | | | 356/497 |
| 2009/0059194 A1 | 3/2009 | Kanaya | |
| 2011/0192964 A1 * | 8/2011 | Makinouchi | G01D 5/34746 |
| | | | 250/231.1 |
| 2013/0050675 A1 | 2/2013 | Jansen et al. | |

* cited by examiner

POSITION MEASUREMENT SYSTEM, CALIBRATION METHOD, LITHOGRAPHIC APPARATUS AND DEVICE MANUFACTURING METHOD

CROSS REFERENCE TO RELATED APPLICATIONS

This application is the U.S. national phase entry of PCT patent application no. PCT/EP2017/059255, which was filed on Apr. 19, 2017, which claims the benefit of priority European patent application no. 16168724.9, which was filed on May 9, 2016, and which is incorporated herein in its entirety by reference.

This application claims priority of EP application 16168724.9 which was filed on May 9, 2016 and which is incorporated herein in its entirety by reference.

BACKGROUND

Field of the Invention

The present invention relates to a position measurement system, a calibration method for the position measurement system, a lithographic apparatus comprising such a position measurement system and a device manufacturing method in which use is made of such a position measurement system.

Description of the Related Art

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

Lithographic apparatus usually comprise a plurality of moveable components of which the position needs to be known very accurately to obtain an accurate transfer of the pattern to the target portion. Key in obtaining the position are position measurement systems. Depending on the application and the required accuracy, the position measurement systems may be based on the principle of letting two measurement waves interfere with each other after at least one of the measurement waves has interacted with an object, e.g. a target, on the moveable component to change the phase of the measurement wave(s). By detecting the intensity after interference, a signal can be obtained that represents the phase difference between the measurement waves. The signal is thus also representative of the position of the moveable component.

However, position measurement systems need to be calibrated e.g. in order to avoid measurement errors that have a periodic dependence on the object position. The calibration needs to be repeated regularly, since the effects to be compensated tend to vary with time and operating point. Currently, the position measurement systems require the moveable component to move over a substantial distance during calibration, resulting in a significant interruption of normal operation of the component.

SUMMARY

It is desirable to provide a position measurement system which requires less interruption of normal operation due to calibration.

According to an embodiment of the invention, there is provided a position measurement system configured to measure a position of an object, comprising:
an optical system to obtain a first measurement wave and a second measurement wave from a radiation source, and to allow the first and second measurement wave to at least partially interfere with each other after interaction of at least one of the first and second measurement wave with the object to form a first detection beam;
a first detector to receive the first detection beam; and
a processing unit configured to receive an output from the first detector and to determine a signal representative for the position of the object from the output,
wherein the optical system comprises a phase modulator configured to modulate a phase difference between the first measurement wave and the second measurement wave.

According to another embodiment of the invention, there is provided a calibration method for a position measurement system according to the invention, comprising the steps of:
a) adapting the phase difference applied between the first measurement wave and the second measurement wave by the phase modulator to one or more different values;
b) obtaining detector output data for each of the one or more different values; and
c) determining from the obtained detector output data at least one compensation parameter to compensate for measurement errors that have a periodic dependence on the position of the object.

According to yet another embodiment of the invention, there is provided a lithographic apparatus including a position measurement system according to the invention.

According to a further embodiment of the invention, there is provided a device manufacturing method wherein use is made of a position measurement system according to the invention or a lithographic apparatus according to the invention.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
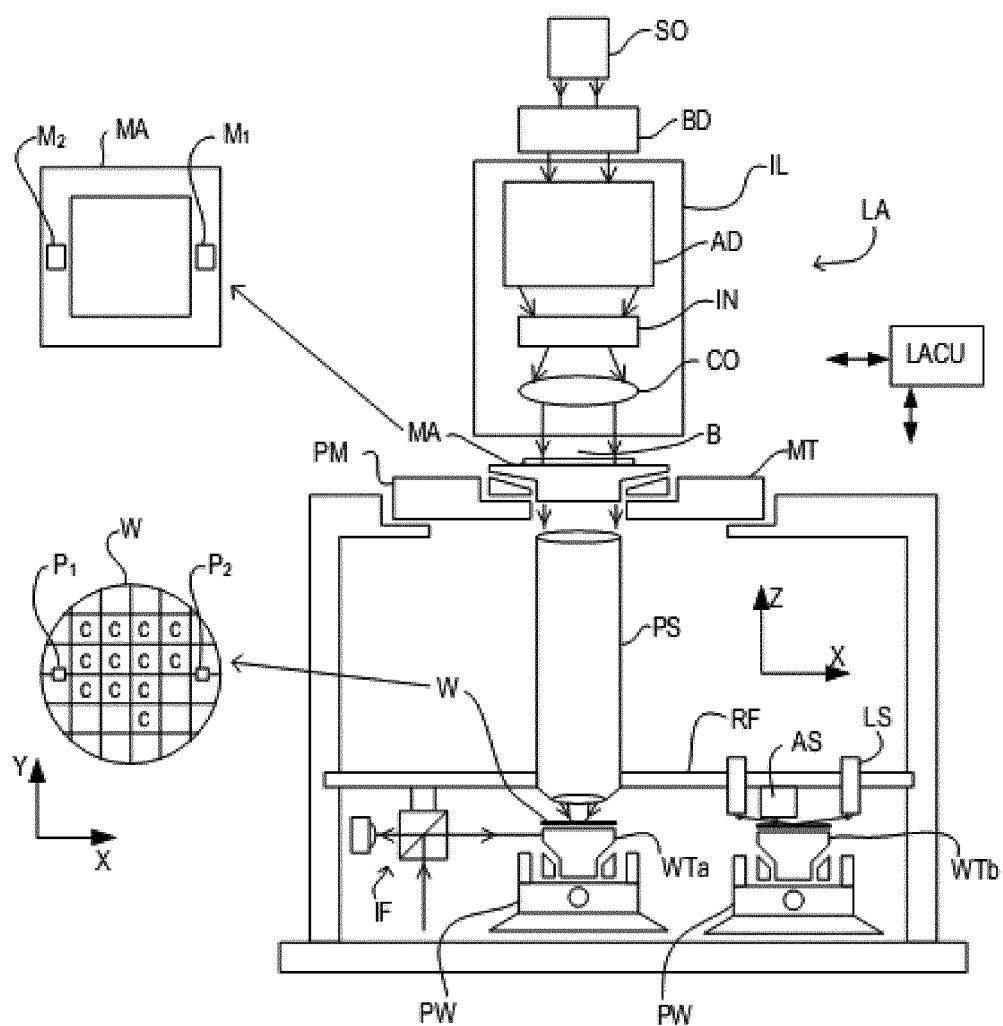
FIG. 1 depicts a lithographic apparatus according to an embodiment of the invention.

FIG. 1 schematically depicts a lithographic apparatus according to one embodiment of the invention. The apparatus comprises:

- an illumination system (illuminator) IL configured to condition a radiation beam B (e.g. UV radiation or EUV radiation).
- a support structure (e.g. a mask table) MT constructed to support a patterning device (e.g. a mask) MA and connected to a first positioner PM configured to accurately position the patterning device in accordance with certain parameters;
- a substrate table (e.g. a wafer table) WTa or WTb constructed to hold a substrate (e.g. a resist-coated wafer) W and connected to a second positioner PW configured to accurately position the substrate in accordance with certain parameters; and
- a projection system (e.g. a refractive projection lens system) PS configured to project a pattern imparted to the radiation beam B by patterning device MA onto a target portion C (e.g. comprising one or more dies) of the substrate W.

The illumination system IL may include various types of optical components, such as refractive, reflective, magnetic, electromagnetic, electrostatic or other types of optical components, or any combination thereof, for directing, shaping, and/or controlling radiation.

The support structure MT supports, i.e. bears the weight of, the patterning device MA. The support structure MT holds the patterning device MA in a manner that depends on the orientation of the patterning device MA, the design of the lithographic apparatus, and other conditions, such as for example whether or not the patterning device MA is held in a vacuum environment. The support structure MT can use mechanical, vacuum, electrostatic or other clamping techniques to hold the patterning device MA. The support structure MT may be a frame or a table, for example, which may be fixed or movable as required. The support structure MT may ensure that the patterning device MA is at a desired position, for example with respect to the projection system PS. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate W. It should be noted that the pattern imparted to the radiation beam may not exactly correspond to the desired pattern in the target portion of the substrate W, for example if the pattern includes phase-shifting features or so called assist features. Generally, the pattern imparted to the radiation beam will correspond to a particular functional layer in a device being created in the target portion, such as an integrated circuit.

The patterning device MA may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "radiation beam" used herein encompass all types of electromagnetic radiation, including ultraviolet (UV) radiation (e.g. having a wavelength of or about 365, 248, 193, 157 or 126 nm) and extreme ultraviolet (EUV) radiation (e.g. having a wavelength in the range of 5-20 nm), as well as particle beams, such as ion beams or electron beams.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure. The two substrate tables WTa and WTb in the example of FIG. 1 are an illustration of this. The invention disclosed herein can be used in a stand-alone fashion, but in particular it can provide additional functions in the pre-exposure measurement stage of either single- or multi-stage apparatuses. In addition to the substrate support WT, the lithographic apparatus LA may comprise a measurement stage. The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides an immersion liquid. The measurement stage may move beneath the projection system PS when the substrate support WT is away from the projection system PS.

The lithographic apparatus may also be of a type wherein at least a portion of the substrate W may be covered by a liquid having a relatively high refractive index, e.g. water, so as to fill a space between the projection system PS and the substrate W. An immersion liquid may also be applied to other spaces in the lithographic apparatus, for example, between the patterning device MA and the projection system PS Immersion techniques are well known in the art for increasing the numerical aperture of projection systems. The term "immersion" as used herein does not mean that a structure, such as a substrate W, must be submerged in liquid, but rather only means that liquid is located between the projection system PS and the substrate W during exposure.

Referring to FIG. 1, the illuminator IL receives a radiation beam from a radiation source SO. The radiation source SO and the lithographic apparatus LA may be separate entities, for example when the radiation source SO is an excimer laser. In such cases, the radiation source SO is not considered to form part of the lithographic apparatus LA and the radiation beam B is passed from the radiation source SO to the illuminator IL with the aid of a beam delivery system BD comprising, for example, suitable directing mirrors and/or a beam expander. In other cases the radiation source SO may be an integral part of the lithographic apparatus LA, for example when the source is a mercury lamp. The radiation source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator IL may be used to condition the radiation beam, to have a desired uniformity and intensity distribution in its cross-section.

The radiation beam B is incident on the patterning device MA (e.g., mask), which is held on the support structure MT (e.g., mask table), and is patterned by the patterning device MA. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WTa/WTb can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan.

The first positioner PM may comprise a long-stroke module and a short-stroke module. The short-stroke module is arranged to move the support structure MT relative to the long-stroke module with a high accuracy over a small range of movement. The long-stroke module is arranged to move the short-stroke module relative to the projection system PS with a low accuracy over a large range of movement. With the combination of the long-stroke module and the short-stroke module, the first positioner PM is able to move the support structure MT relative to the projection system PS with a high accuracy over a large range of movement. Similarly, the second positioner PW may comprise a long-stroke module and a short-stroke module. The short-stroke module is arranged to move the substrate support WT relative to the long-stroke module with a high accuracy over a small range of movement. The long-stroke module is arranged to move the short-stroke module relative to the projection system PS with a low accuracy over a large range of movement. With the combination of the long-stroke module and the short-stroke module, the second positioner PW is able to move the substrate support WT relative to the projection system PS with a high accuracy over a large range of movement.

In the case of a stepper (as opposed to a scanner) the support structure MT may be connected to a short-stroke actuator only, or may be fixed. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions C. When the substrate alignment marks P1, P2 are located in spaces between the target portions C, they are known as scribe-lane alignment marks). Similarly, in situations in which more than one die is provided on the patterning device MA, the mask alignment marks M1, M2 may be located between the dies.

The depicted lithographic apparatus LA can at least be used in scan mode, in which the support structure MT and the substrate table WTa/WTb are scanned synchronously while a pattern imparted to the radiation beam is projected onto a target portion C (i.e. a single dynamic exposure). The velocity and direction of the substrate table WTa/WTb relative to the support structure MT may be determined by the (de)-magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

In addition to the scan mode, the depicted apparatus could be used in at least one of the following modes:

1. In step mode, the support structure MT and the substrate table WTa/WTb are kept essentially stationary, while an entire pattern imparted to the radiation beam is projected onto a target portion C at one time (i.e. a single static exposure). The substrate table WTa/WTb is then shifted in the X and/or Y direction so that a different target portion C can be exposed. In step mode, the maximum size of the exposure field limits the size of the target portion C imaged in a single static exposure.

2. In another mode, the support structure MT is kept essentially stationary holding a programmable patterning device, and the substrate table WTa/WTb is moved or scanned while a pattern imparted to the radiation beam is projected onto a target portion C. In this mode, generally a pulsed radiation source is employed and the programmable patterning device is updated as required after each movement of the substrate table WTa/WTb or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Lithographic apparatus LA is of a so-called dual stage type which has two substrate tables WTa and WTb and two stations—an exposure station and a measurement station—between which the substrate tables WTa, WTb can be exchanged. While one substrate on one substrate table Wta is being exposed at the exposure station, another substrate W can be loaded onto the other substrate table WTb at the measurement station so that various preparatory steps may be carried out. The preparatory steps may include mapping the surface of the substrate W using a level sensor LS and measuring the position of substrate alignment markers P1, P2 on the substrate W using an alignment sensor AS. This enables a substantial increase in the throughput of the lithographic apparatus LA. If the position sensor IF is not capable of measuring the position of the substrate table WTa, WTb while it is at the measurement station as well as at the exposure station, a second position sensor may be provided to enable the positions of the substrate table WTa, WTb to be tracked at both stations.

The lithographic apparatus LA further includes a control unit LACU which controls all the movements and measurements of the various actuators and sensors described. Control unit LACU also includes signal processing and data processing capacity to implement desired calculations relevant to the operation of the lithographic apparatus LA. In practice, control unit LACU will be realized as a system of many sub-units, each handling the real-time data acquisition, processing and control of a subsystem or component within the apparatus. For example, one processing subsystem may be dedicated to servo control of the substrate positioner PW. Separate units may even handle coarse and fine actuators, or different axes. Another unit might be dedicated to the readout of the position sensor IF. Overall control of the apparatus may be controlled by a central processing unit, communicating with these sub-systems processing units, with operators and with other apparatuses involved in the lithographic manufacturing process.

Figure 2:
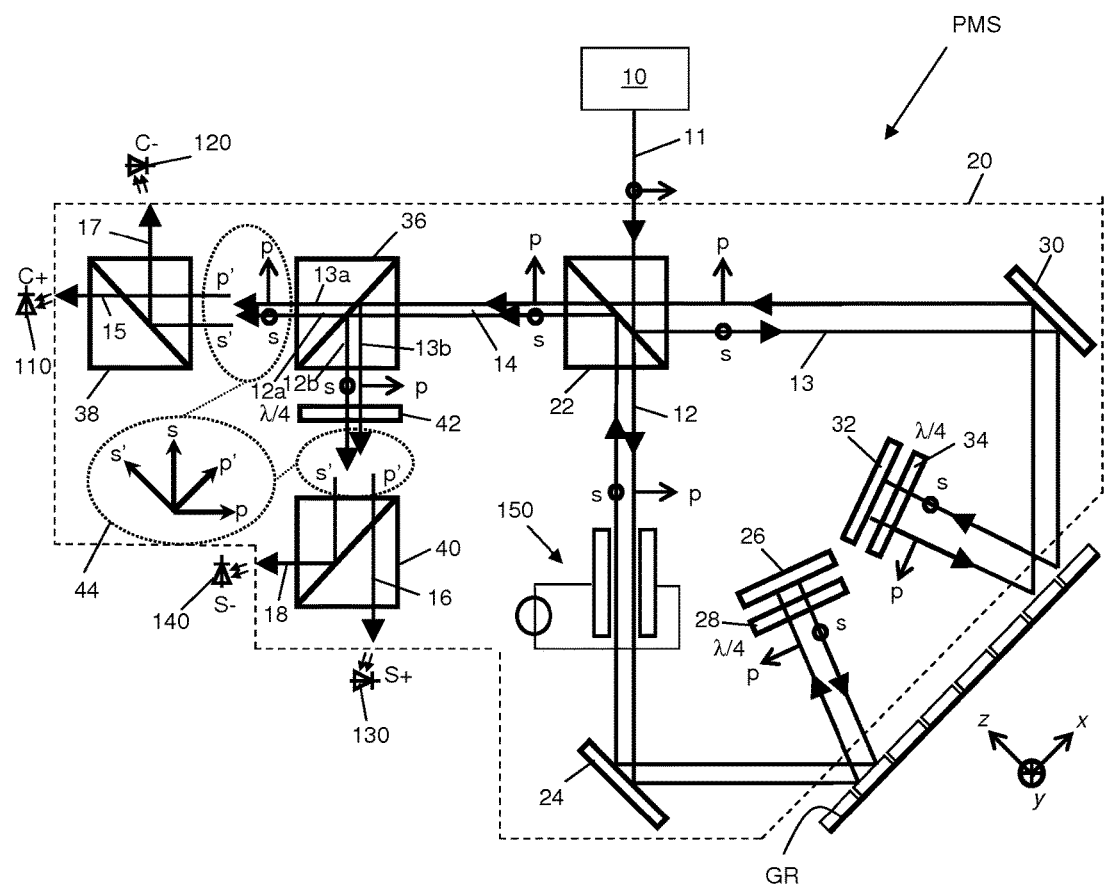
FIG. 2 depicts schematically a position measurement system according to an embodiment of the invention.

In order to measure the position of components of the lithographic apparatus LA, e.g. optical components like lenses or mirrors in the projection system PS, the lithographic apparatus LA comprises one or more position measurement systems. FIG. 2 schematically depicts a position measurement system PMS according to an embodiment of the invention.

The position measurement system PMS comprises a light source 10, an optical system 20, a first detector 110, a second detector 120, a third detector 130 and a fourth detector 140. The position measurement system PMS is configured to measure the position of an object, in this embodiment a grating GR attached to or provided on a component of the lithographic apparatus. It is noted here that the light source 10 does not necessarily form part of the position measurement system PMS. A separate light source may be used to provide radiation beam to the position measurement system PMS. The light source 10 may be any suitable type of radiation source to provide a radiation beam.

The light source 10 provides a radiation beam 11 comprising light having a p polarization, which in this embodiment is linear polarization parallel to the plane of drawing, and light having an s polarization orthogonal to the p polarization, which is thus linear polarization perpendicular to the plane of drawing. The p polarization is indicated by arrows having a reference p, which arrows are perpendicular to the propagation direction of the respective beam and in plane of the drawing. The s polarization is indicated by small circles having an s reference. These small circles are representative for arrows perpendicular to the propagation direction of the respective beam and out of plane of the drawing thereby being orthogonal to the p polarization.

Optical components described below have an orientation such that their plane of incidence comprise a direction normal to the plane of the drawing.

The optical system 20 comprises a polarizing beam splitter 22 which splits the radiation beam 11 into a first measurement wave 12 having p polarization and a second measurement wave 13 having s polarization.

The first measurement wave 12 is guided along a first optical path by mirror 24 towards the grating GR to reflect thereof towards a mirror 26 while passing a quarter-wave plate 28, which mirror 26 reflects the first measurement wave back towards the grating GR while passing the quarter-wave plate 28 again so that the first measurement wave returns via mirror 24 to the polarizing beam splitter 22 and has an s polarization caused by passing the quarter-wave plate 28 twice. To this end the quarter-wave plate 28 is oriented such that either one of its principal birefringence axes is aligned parallel to the polarization direction of the incident measurement wave.

The second measurement wave 13 is guided along a second optical path different from the first optical path. The second measurement wave 13 is guided by mirror 30 towards the grating GR to reflect thereof towards a mirror 32 while passing a quarter-wave plate 34. The mirror 32 reflects the second measurement wave 13 back towards the grating GR while passing the quarter-wave plate 34 again so that the second measurement wave returns via mirror 30 to the polarizing beam splitter 22 having a p polarization caused by passing the quarter-wave plate 34 twice.

Due to the change of polarization state of both the first and second measurement waves 12, 13, they are combined again after the polarizing beam splitter 22 to form a combined measurement wave 14.

The combined measurement wave 14 is split by a normal beam splitter 36, so that a first part 12a of the first measurement wave 12 and a first part 13a of the second measurement wave 13 together propagate towards a polarizing beam splitter 38, and so that a second part 12b of the first measurement wave 12 and a second part 13b of the second measurement wave 13 together propagate towards a polarizing beam splitter 40 while first passing a quarter-wave plate 42.

The quarter-wave plate 42 applies an additional predetermined phase-shift of 90 degrees to the second part 12b of the first measurement wave 12 relative to the second part 13b of the second measurement wave 13.

The polarizing beam splitters 38 and 42 have been placed at an angle of 45 degrees to split light into light having a first polarization state p' and light having a second polarization state s' orthogonal to the first polarization state p' and making 45 degrees with the initial p and s polarization as indicated in the figure in dashed circle 44.

In the embodiment of FIG. 2, light having a first polarization state p' is guided towards the first detector 110, resulting in a first detection beam 15 formed by interference of a first portion of the first part 12a of the first measurement wave 12 with a first portion of the first part 13a of the second measurement wave 13. Light having the first polarization state p' is also guided towards the third detector 130, resulting in a third detection beam 16 formed by interference of a first portion of the second part 12b of the first measurement wave 12 with a first portion of the second part 13b of the second measurement wave 13.

Light having a second polarization state s' is guided towards the second detector 120, resulting in a second detection beam 17 formed by interference of a second portion of the first part 12a of the first measurement wave 12 with a second portion of the first part 13a of the second measurement wave 13. Light having the second polarization state s' is also guided towards the fourth detector 140, resulting in a fourth detection beam 18 formed by interference of a second portion of the second part 12b of the first measurement wave 12 with a second portion of the second part 13b of the second measurement wave 13.

The first 110, second 120, third 130 and fourth 140 detector receive the first 15, second 17, third 16 and fourth 18 detection beam, respectively, and provide an output C+, S+, C−, S−, respectively, which are representative for the intensity of light in the first 15, second 17, third 16 and fourth 18 detection beam, respectively, which intensities are representative for the ±sine and ±cosine of a phase difference between the first and second measurement wave 12,13. The phase difference is representative for the position of the grating in X-direction.

Due to offsets, gain errors and cosine-to-sine angle errors, the phase difference determined on the basis of the outputs may deviate from the actual phase difference, and thus a phase measurement error is introduced. This deviation is a periodic (non-linear) function of the actual phase difference. The offsets, gain errors and cosine-to-sine angle errors may further vary in time. Regular calibration of the position measurement system PMS is therefore required to update the offset-, gain- and angle compensation coefficients values to their optimal values and thereby avoid the phase measurement error. In order to optimally calibrate the position measurement system PMS, e.g. using a Lissajous calibration method, the calibration is preferably performed for five different phase differences evenly distributed between 0-2 π even when the measurement range is smaller than 2 π.

In the embodiment of FIG. 2, the position measurement system PMS comprises a phase modulator 150, in this case an electro-optic phase modulator, arranged in the first optical path to manipulate the first measurement wave 12.

An advantage of adding a phase modulator is that the phase difference between the first and second measurement wave 12, 13 can be adapted independently of the position of the grating GR. The phase modulator 150 is configured to modulate a phase difference between the first measurement wave 12 and the second measurement wave 13 independently of the position of the grating GR. Hence, the component to which the grating GR is attached can still operate, especially when the component is intended to be kept stationary during operation. As inline calibration becomes possible, the time between calibrations can easily decrease, so that parameters used in the determination of the phase difference can be updated before periodic non-linearities start to develop. This will increase the average accuracy. An inline calibration is a calibration that can be done without substantially interruption the operational use of the position measurement system PMS.

A further advantage may be that calibration can be improved when the moving range during operation is significantly less than one period of the light used. For example, the moving range may cause the outputs C+, S+, C−, S−to be only a fraction of a period of a sine or cosine. Because the phase modulator 150 is able to emulate a larger moving range, a better quality calibration can be achieved.

Yet another advantage may be that rigid body position control can be obtained out of a start-up position. In the start-up position, the object may be near or at an end-stop. Movement of the object is restricted, because the end-stop blocks movement in a certain direction. The phase modulator may emulate movement in that certain direction and thus enables determination of an initial compensation parameter set, which is a requisite to allow a body position control system to operate reliably based on the position measurement system PMS.

Figure 3:
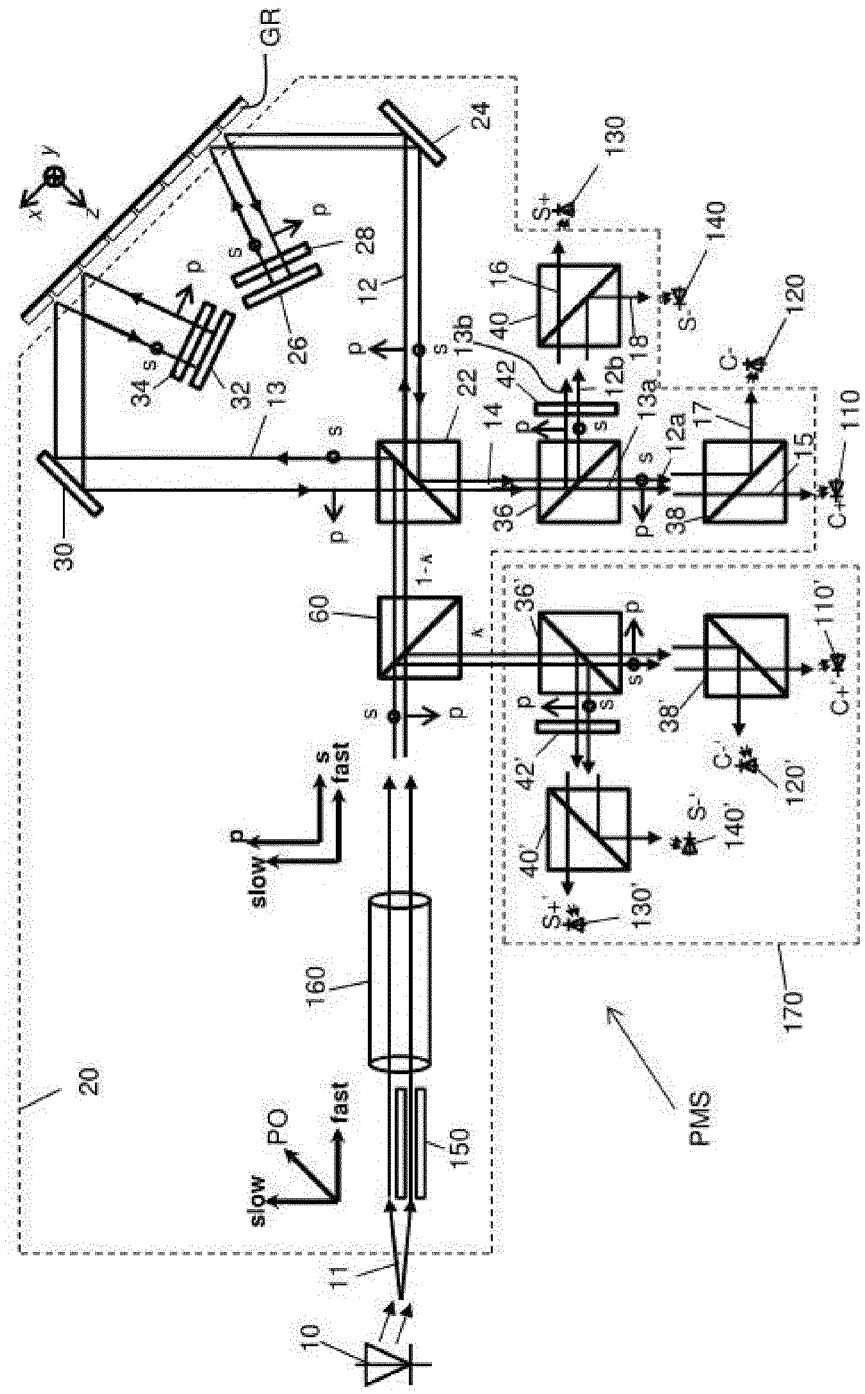
FIG. 3 depicts schematically a position measurement system according to another embodiment of the invention.

FIG. 3 depicts a position measurement system PMS according to another embodiment of the invention. There are some similarities with respect to the embodiment of FIG. 2 which will be briefly described below. For a more elaborate description reference is made to FIG. 2 and the corresponding description.

The position measurement system PMS comprises a light source 10 and an optical system 20, and is configured to measure a position of a grating GR. Light from the light source 10 is eventually provided to a polarizing beam splitter 22, which splits the light into a first measurement wave 12 having p polarization and a second measurement wave 13 having s polarization. The optical system 20 after the polarizing beam splitter 22 is similar to the embodiment of FIG. 2. Eventually, the optical system 20 derives four different detection beams 15, 16, 17, 18 which are detected by four corresponding detectors 110, 120, 130, 140.

The main differences between the embodiment of FIG. 3 and the embodiment of FIG. 2 is the part of the optical system 20 between the light source 10 and the polarizing beam splitter 22, and the location of the phase modulator 150.

The light source 10 outputs a radiation beam 11 which is provided to an optical fiber 160 which comprises birefringent material, such that the polarization PO of the radiation beam 11 is oriented at 45 degrees to both the slow and fast axis of the optical fiber 160. Light coming out of the fiber 160 thus comprises radiation having p polarization aligned with the slow axis, which will later on form the first measurement wave 12. Radiation having s polarization is aligned with the fast axis, which will later on form the second measurement wave 13, with an unknown and time-varying phase difference with respect to the first measurement wave 12.

The position measurement system PMS therefore comprises a reference phase-difference detection system 170. A beam splitter 60 is provided to guide a portion x of the radiation beam 11 towards the reference phase-difference detection system 170. Portion x is preferably relatively small, for example less than 10% or less than 5%.

In this embodiment, the reference phase-difference detection system 170 is similar to the optical system 20 downstream of the polarizing beam splitter 22 which is indicated by giving similar parts the same reference symbol supplemented with an apostrophe. This has the advantage that the phase difference prior to interaction with the grating GR and after interaction with the grating GR is determined in an identical manner.

An advantage of the embodiment of FIG. 3, besides the advantages already described in relation to FIG. 2, is that the light source 10 and phase modulator 150 can be arranged at a relatively large distance from the grating GR, so that for instance, the light source 10 and the phase modulator 150 can be arranged in a non-vacuum environment while the grating is arranged in a vacuum environment of the lithographic apparatus LA.

Figure 4:
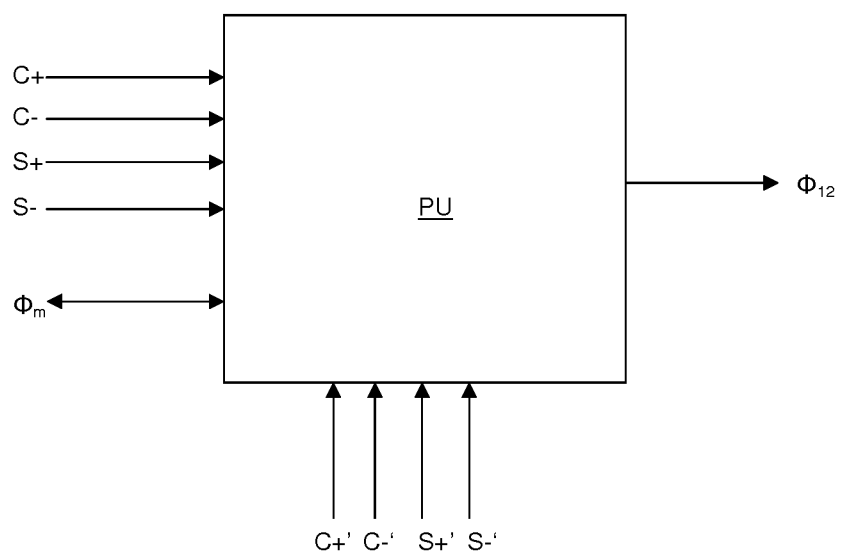
FIG. 4 depicts a processing unit of a position measurement system according to an embodiment of the invention.

FIG. 4 depicts schematically a processing unit PU suitable to process the outputs C+, C−, S+, S− of the first to fourth detector 110, 120, 130, 140 of the position measurement system PMS of FIG. 3, to process the outputs C+', C−', S+', S−' of the first 110', second 120', third 130' and fourth 140' detector of the reference phase-difference detection system 170, and to process the additional phase difference $\phi_m$ applied by the phase modulator 150.

The C+, C−, S+, S− of the first to fourth detector of the position measurement system PMS are used to determine a phase difference between the first and second measurement wave 12, 13 after interaction with the grating GR. The outputs C+', C−', S+', S−' of the first 110', second 120', third 130' and fourth 140' detector of the reference phase-difference detection system 170 are used to determine a phase difference between the first and second measurement wave 12, 13 prior to interaction with the grating GR, so that a phase difference $\phi_{12}$ can be determined that is caused by the interaction with the grating GR and that is representative for the position of the grating GR in the X-direction.

The additional phase difference $\phi_m$ applied by the phase modulator 150 is used to calibrate the processing unit PU. The phase difference $\phi_m$ may be an output provided to the phase modulator 150, may be an input provided by the phase modulator 150 to the processing unit PU and may be both.

In an embodiment, the processing unit PU is configured to receive information $\phi_m$ representative for the phase difference between the first and second measurement wave 12, 13 applied by the phase modulator 150 and to use the information to compensate the signal $\phi_{12}$ representative for the position for said phase difference applied by the phase modulator 150.

In an embodiment, the processing unit PU is further configured to use the information $\phi_m$ to compensate the reference phase-difference detection system 170 for the phase difference applied by the phase modulator 150.

Calibration of the position measurement systems PMS of FIGS. 2 and 3 may comprises the steps of:
a) adapting the phase difference applied between the first measurement wave and the second measurement wave by the phase modulator to one or more different values;
b) obtaining detector output data for each of the one or more different values; and
c) determining from the obtained detector output data at least one compensation parameter to compensate for measurement errors that have a periodic dependence on the position of the object.

In an embodiment, the object is kept stationary during the calibration method.

Further, at least five different values may be applied by the phase modulator during calibration.

In an embodiment, a similar calibration is performed for the reference phase-difference detection system. The calibration of the reference phase-difference detection system may be performed parallel to calibration of the optical system and detectors upstream of the reference phase-difference detection system.

Although the shown embodiments describe a single position measurement system, the embodiment of FIG. 3 is in particular suitable to be used in combination with similar position measurement systems, where the light source and phase modulator are shared by the plurality of position measurement systems, and the light is distributed by a hierarchical tree of fiber bundles and fiber couplers.

In the embodiments described above, the first and second measurement wave 12, 13 are incident on the grating GR. The position measurement system PMS described above may therefore be considered to be an encoder system. In a further embodiment, the first and second measurement wave 12, 13 are incident on a mirror instead of a grating GR. The first and second measurement wave 12, 13 may be incident on the same mirror or multiple mirrors on the same component, for example to measure a rotational position of the component. Alternatively, one of the first and second measurement wave 12, 13 is incident on a mirror coupled to the component, while the other of the first and second measurement wave 12, 13 is incident on a reference mirror that is not coupled to the component. For example, the reference mirror may be coupled to a reference frame. The embodiments in which the position measurement system PMS has at least one mirror instead of a grating GR may be considered an interferometer system.

In an embodiment, there is provided a position measurement system configured to measure a position of an object, comprising: an optical system to obtain a first measurement wave and a second measurement wave from a radiation source, and to allow the first measurement wave and the second measurement wave to at least partially interfere with each other after interaction of at least one of the first measurement wave and the second measurement wave with the object to form a first detection beam; a first detector to receive the first detection beam; and a processing unit configured to receive an output from the first detector and to determine a signal representative for the position of the object from the output, wherein the optical system comprises a phase modulator configured to modulate a phase difference between the first measurement wave and the second measurement wave.

In an embodiment, both the first measurement wave and the second measurement wave interact with the object prior to interfering with each other. In an embodiment, the object is a grating or a mirror. In an embodiment, the optical system is configured to guide the first measurement wave along a first optical path, and to guide the second measurement wave along a second optical path which is different from the first optical path, wherein the phase modulator is arranged in the first and/or second optical path at a location before the first measurement wave and the second measurement wave interfere with each other. In an embodiment, the optical system is configured to form the first detection beam by interference of a first portion of the first measurement wave having a first polarization state interfere with a first portion of the second measurement wave having the same first polarization state, wherein the optical system is further configured to form a second measurement beam by interference of a second portion of the first measurement having a second polarization state different from the first polarization state interfere with a second portion of the second measurement wave having the same second polarization state, wherein the position measurement system further comprises a second detector to receive the second detection beam, and wherein the processing unit is further configured to receive an output from the second detector and to determine the signal representative for the position of the object from the outputs of the first and second detector. In an embodiment, the optical system is configured to split the first measurement wave into a first part and a second part and to split the second measurement wave into a corresponding first part and a second part, wherein the first detection beam is formed by interference of a first portion of the first part of the first measurement wave and a first portion of the first part of the second measurement wave, wherein the second detection beam is formed by interference of a second portion of the first part of the first measurement wave and a second portion of the first part of the second measurement wave, wherein the optical system is further configured to apply an additional predetermined phase shift to the second part of the first measurement wave relative to the second part of the second measurement wave, to form a third detection beam by interference of a first portion of the phase-shifted second part of the first measurement wave having a first polarization state with a first portion of the second part of the second measurement wave having the same first polarization state, and to form a fourth detection beam by interference of a second portion of the phase-shifted second part of the first measurement wave having a second polarization state different from the first polarization state with a second portion of the second part of the second measurement wave having the same second polarization state, wherein the position measurement system further comprises a third detector to receive the third detection beam and a fourth detector to receive the fourth detection beam, and wherein the processing unit is configured to receive an output from the third detector and an output from the fourth detector and to determine a signal representative for the position of the object from the outputs of the first, second, third and fourth detector. In an embodiment, the position measurement system further comprises a reference phase-difference detection system to determine a phase difference between the first measurement wave and the second measurement wave prior to interaction of the first measurement wave and/or the second measurement wave with the object, wherein the processing unit is further configured to receive an output of the reference phase-difference detection system, and to determine the signal representative for the position of the object from the output of the reference phase-difference detection as well. In an embodiment, the phase modulator is arranged upstream of the reference phase-difference detection system. In an embodiment, the processing unit is configured to receive information representative for the phase difference between the first measurement wave and the second measurement wave applied by the phase modulator and to use the information to compensate the signal representative for the position for the phase difference applied by the phase modulator. In an embodiment, the processing unit is configured to receive information representative for the phase difference between the first and second measurement wave applied by the phase modulator and to use the information to compensate the signal representative for the position for the phase difference applied by the phase modulator, wherein the processing unit is further configured to use the information to compensate the reference phase-difference detection system for the phase difference applied by the phase modulator.

In an embodiment, there is provided a calibration method for a position measurement system described herein, the calibration method comprising: adapting the phase difference applied between the first measurement wave and the second measurement wave by the phase modulator to one or more different values; obtaining detector output data for each of the one or more different values; and determining from the obtained detector output data at least one compensation parameter to compensate for measurement errors that have a periodic dependence on the position of the object.

In an embodiment, there is provided a lithographic apparatus comprising a position measurement system as described herein to measure the position of an object which is part of the lithographic apparatus. In an embodiment, the lithographic apparatus comprises: an illumination system configured to condition a radiation beam; a support constructed to support a patterning device, the patterning device being capable of imparting the radiation beam with a pattern in its cross-section to form a patterned radiation beam; a substrate table constructed to hold a substrate; and a projection system configured to project the patterned radiation beam onto a target portion of the substrate, wherein the object is a target on an optical element of the projection system. In an embodiment, the lithographic apparatus comprises a plurality of position measurement systems as described herein, wherein the plurality of position measurement systems share the light source and the phase modulator.

In an embodiment, there is provided a device manufacturing method wherein use is made of a position measurement system as described herein or a lithographic apparatus as described herein.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A position measurement system configured to measure a position of an object, the position measurement system comprising:
    an optical system to obtain a first measurement wave and a second measurement wave from a radiation source, and to allow the first measurement wave and the second measurement wave to at least partially interfere with each other after interaction of the first measurement wave and/or the second measurement wave with the object to form a first detection beam, wherein the optical system comprises a phase modulator configured to modulate a phase difference between the first measurement wave and the second measurement wave;
    a first detector to receive the first detection beam; and
    a processing unit configured to receive an output from the first detector and to determine a signal representative for the position of the object from the output.

2. The position measurement system according to claim 1, wherein both the first measurement wave and the second measurement wave interact with the object prior to interfering with each other.

3. The position measurement system according to claim 1, wherein the object is a grating or a mirror.

4. The position measurement system according to claim 1, wherein the optical system is configured to guide the first measurement wave along a first optical path, and to guide the second measurement wave along a second optical path which is different from the first optical path, wherein the phase modulator is arranged in the first and/or second optical path at a location before where the first measurement wave and the second measurement wave interfere with each other.

5. The position measurement system according to claim 1, wherein the optical system is configured to form the first detection beam by interference of a first portion of the first measurement wave having a first polarization state with a first portion of the second measurement wave having the same first polarization state, wherein the optical system is further configured to form a second detection beam by interference of a second portion of the first measurement wave having a second polarization state different from the first polarization state with a second portion of the second measurement wave having the same second polarization state, wherein the position measurement system further comprises a second detector to receive the second detection beam, and wherein the processing unit is further configured to receive an output from the second detector and to determine the signal representative for the position of the object from the outputs of the first and second detector.

6. The position measurement system according to claim 5, wherein the optical system is configured to split the first measurement wave into a first part and a second part and to split the second measurement wave into a corresponding first part and a second part, wherein the first detection beam is formed by interference of a first portion of the first part of the first measurement wave with a first portion of the first part of the second measurement wave, wherein the second detection beam is formed by interference of a second portion of the first part of the first measurement wave with a second portion of the first part of the second measurement wave, wherein the optical system is further configured to apply an additional predetermined phase shift to the second part of the first measurement wave relative to the second part of the second measurement wave, to form a third detection beam by interference of a first portion of the phase-shifted second part of the first measurement wave having a first polarization state with a first portion of the second part of the second measurement wave having the same first polarization state, and to form a fourth detection beam by interference of a second portion of the phase-shifted second part of the first measurement wave having a second polarization state different from the first polarization state with a second portion of the second part of the second measurement wave having the same second polarization state, wherein the position measurement system further comprises a third detector to receive the third detection beam and a fourth detector to receive the fourth detection beam, and wherein the processing unit is configured to receive an output from the third detector and an output from the fourth detector and to determine a signal representative for the position of the object from the outputs of the first, second, third and fourth detectors.

7. The position measurement system according to claim 1, further comprising a reference phase-difference detection system to determine a phase difference between the first measurement wave and the second measurement wave prior to interaction of the first measurement wave and/or the second measurement wave with the object, wherein the processing unit is further configured to receive an output of the reference phase-difference detection system, and to determine the signal representative for the position of the object from the output of the reference phase-difference detection as well.

8. The position measurement system according to claim 7, wherein the phase modulator is arranged upstream of the reference phase-difference detection system.

9. The position measurement system according to claim 1, wherein the processing unit is configured to receive information representative for the phase difference between the first measurement wave and the second measurement wave applied by the phase modulator and to use the information to compensate the signal representative for the position for the phase difference applied by the phase modulator.

10. The position measurement system according to claim 7, wherein the processing unit is configured to receive information representative for the phase difference between the first and second measurement waves applied by the phase modulator and to use the information to compensate the signal representative for the position for the phase difference applied by the phase modulator, wherein the processing unit is further configured to use the information to compensate the reference phase-difference detection system for the phase difference applied by the phase modulator.

11. A calibration method for the position measurement system according to claim 1, the calibration method comprising:
adapting the phase difference applied between the first measurement wave and the second measurement wave by the phase modulator to one or more different values;
obtaining detector output data for each of the one or more different values; and
determining from the obtained detector output data at least one compensation parameter to compensate for measurement errors that have a periodic dependence on the position of the object.

12. A lithographic apparatus comprising the position measurement system according to claim 1 to measure the position of an object which is located in the lithographic apparatus.

13. The lithographic apparatus according to claim 12 comprising:
a support constructed to support a patterning device, the patterning device being capable of imparting a radiation beam with a pattern in its cross-section to form a patterned radiation beam;
a substrate table constructed to hold a substrate; and
a projection system configured to project the patterned radiation beam onto a target portion of the substrate,
wherein the object is a target on an optical element of the projection system.

14. The lithographic apparatus according to claim 12, comprising a plurality of the position measurement systems, wherein the plurality of position measurement systems share the radiation source and the phase modulator.

15. A method comprising:
obtaining, using an optical system, a first measurement wave and a second measurement wave from a radiation source;
modulating a phase difference between the first measurement wave and the second measurement wave using a phase modulator;
allowing the first measurement wave and the second measurement wave to at least partially interfere with each other after interaction of the first measurement wave and/or the second measurement wave with an object to form a first detection beam;
using a detector system to receive the first detection beam; and
determining a signal representative for a position of the object based on an output, from the detector system, regarding the first detection beam.

16. The method of claim 15, further comprising:
guiding the first measurement wave along a first optical path; and
guiding the second measurement wave along a second optical path which is different from the first optical path, wherein the phase modulator is arranged in the first and/or second optical path at a location before where the first measurement wave and the second measurement wave interfere with each other.

17. The method of claim 15, further comprising:

forming the first detection beam by interference of a first portion of the first measurement wave having a first polarization state with a first portion of the second measurement wave having the same first polarization state;

forming a second detection beam by interference of a second portion of the first measurement wave having a second polarization state different from the first polarization state with a second portion of the second measurement wave having the same second polarization state;

using the detector system to receive the second detection beam; and determining the signal representative for the position of the object from the output regarding the first detection beam and an output, from the detector system, regarding the second detection beam.

18. The method of claim 15, further comprising determining a phase difference between the first measurement wave and the second measurement wave prior to interaction of the first measurement wave and/or the second measurement wave with the object using a reference phase-difference detection system, and determining the signal representative for the position of the object from an output of the reference phase-difference detection as well.

19. The method of claim 15, further comprising using information representative for the phase difference between the first measurement wave and the second measurement wave applied by the phase modulator to compensate the signal representative for the position for the phase difference applied by the phase modulator.

20. A device manufacturing method wherein use is made of the signal determined using the method of claim 15 in the manufacturing of a device.

* * * * *